United States Patent [19]
Cheng et al.

[11] Patent Number: 6,159,821
[45] Date of Patent: Dec. 12, 2000

[54] METHODS FOR SHALLOW TRENCH ISOLATION

[75] Inventors: Hsu-Li Cheng, Hsinchu; Wei-Ray Lin, Taipei; Fu-Liang Yang, Tainan, all of Taiwan

[73] Assignee: Vanguard International Semiconductor Corporation, Hsin-Chu, Taiwan

[21] Appl. No.: 09/249,255

[22] Filed: Feb. 12, 1999

[51] Int. Cl.$^7$ ................................................ H01L 21/76
[52] U.S. Cl. .......................... 438/424; 438/296; 438/427
[58] Field of Search .................................. 438/424, 221, 438/296, 359, 427

[56] References Cited

U.S. PATENT DOCUMENTS

| | | | |
|---|---|---|---|
| 4,389,294 | 6/1983 | Anantha et al. | 438/424 |
| 4,692,992 | 9/1987 | Hsu | 438/224 |
| 5,229,316 | 7/1993 | Lee et al. | 437/67 |
| 5,433,794 | 7/1995 | Fazan et al. | 148/33.3 |
| 5,712,185 | 1/1998 | Tsai et al. | 438/424 |
| 5,731,241 | 3/1998 | Jang et al. | 438/424 |
| 5,930,645 | 7/1999 | Lyons et al. | 438/424 |
| 5,940,717 | 8/1999 | Rengarajan et al. | 438/424 |
| 5,994,201 | 11/1999 | Lee | 438/424 |
| 5,998,278 | 12/1998 | Yu | 438/424 |
| 6,001,706 | 12/1999 | Tan et al. | 438/424 |
| 6,043,133 | 3/2000 | Jang et al. | 438/424 |

OTHER PUBLICATIONS

Chang et al., "ULSI Technology", The McGraw Hill Co., Inc., 1996, p. 354. No Month.
Fazan et al., "A Highly Manufacturable Trench Isolation Process of Deep Submicron DRAMS", IEDM Tech Digest 93–57, p. 3.6.1–3.6.4. No date.

*Primary Examiner*—Charles Bowers
*Assistant Examiner*—David S Blum
*Attorney, Agent, or Firm*—George O. Saile; Stephen B. Ackerman; Rosemary L. S. Pike

[57] ABSTRACT

A method for forming self-rounded shallow trench isolation is described. A pad oxide layer is provided over the surface of a semiconductor substrate. A nitride layer is then deposited overlying the pad oxide layer. Isolation trenches are then etched through the nitride and pad oxide layers into the semiconductor substrate. A layer of oxide is then deposited over the said nitride layer and within the isolation trenches. The oxide layer is then polished away through chemical and mechanical polishing wherein the substrate is planarized. The nitride layer is then etched away using a special dry-etch recipe that has a higher etching rate for silicon nitride than oxide. The dry-etch recipe also has a very low etching rate for the silicon substrate. This results in the removal of the nitride layer, rounding the shoulders of the trench and leaving the substrate unaffected. The fabrication of the integrated circuit device is completed.

19 Claims, 5 Drawing Sheets

METHODS FOR SHALLOW TRENCH ISOLATION

BACKGROUND OF THE INVENTION (1) Field of the Invention

The present invention relates to the fabrication of integrated circuit devices, and more particularly, to a method of efficiently forming high quality oxide shallow trench isolation in the fabrication of integrated circuits.

(2) Description of the Prior Art

Shallow trench isolation (STI) is gaining substantial interest in integrated circuit manufacturing. Most STI uses ozone-TEOS (tetraethoxysilane) for gap-filling, then resist etchback and chemical mechanical polishing (CMP) for planarization.

The conventional STI approach as in U.S. Pat. No. 5,229,316 to Lee et. al, uses CMP as the preferred planarized etching technique. This is followed by a wet etching process to remove the sacrificial layer of material. This leaves a pillar of trench filling material projecting upwardly relative to an upper substrate surface. The pillar of trench filling material must then be smoothed over so that the shoulders of the trench are rounded. Rounded shoulders are required for subsequent processes, e.g., poly gate etching.

Fazan and Mathes, "A Highly Manufacturable Trench Isolation Process of Deep Submicron DRAMS," *IEDM Tech Digest* 93–57, p. 3.6.1 to 3.6.4, describes how wet etching combined with the formation of oxide disposable spacers are used to avoid sharp corners at the trench edges. This technique is also described in U.S. Pat. No. 5,433,794 to Fazan et al.

Sharp corners at the trench edges are to be avoided because they can be responsible for various device leakage mechanisms such as the anomalous subthreshold current, the Gate Induced Drain Leakage at the 3-D intersection of the gate-to-drain overlap region and the trench corner and poly-stringers which can short together polysilicon layers.

Chang and Sze, in *ULSI Technology*, by The McGraw-Hill Company, Inc., copyright 1996, p.354 show various dry etch chemistries for silicon nitride (SiN) and silicon dioxide ($SiO_2$).

U.S. Pat. No. 5,731,241 to Jang et al shows a self-aligned sacrificial oxide layer over the STI isolation layer and an etch back of the sacrificial oxide layer. Jang does not simultaneously etch the silicon nitride layer and the oxide layer.

U.S. Pat. No. 5,229,316 to Lee et al shows a method for wet-etching the pillar of trench filling material to round the corners of the trench. The method etches the pillar of trench filling material separately from the nitride layer.

This invention uses a specialized dry etching recipe to replace the aforementioned two steps: (1) removal of the layer of sacrificial material and (2) smoothing of the pillar of trench filling material, with a single step that removes the layer of sacrificial material and leaves a rounded shoulder over the edges of the trench.

SUMMARY OF THE INVENTION

Accordingly, the primary object of the invention is to provide a process for forming self-rounded shallow trench isolation in the fabrication of integrated circuits.

A further object of the invention is to provide a process for efficiently forming high quality oxide shallow trench isolation by using fewer steps in the process.

In accordance with the objects of the invention, a method for forming self-rounded shallow trench isolation is achieved. A pad oxide layer is provided over the surface of a semiconductor substrate. A nitride layer is then deposited overlying the pad oxide layer. Isolation trenches are then etched through the nitride and pad oxide layers into the semiconductor substrate. A layer of oxide is then deposited over the nitride layer and within the isolation trenches. The oxide layer is then polished away through chemical and mechanical polishing wherein the substrate is planarized. The nitride layer is then etched away using a special dry-etch recipe that has a higher etching rate for silicon nitride than oxide. The dry-etch recipe also has a very low etching rate for the silicon substrate. This results in the removal of the nitride layer, rounding the shoulders of the trench and leaving the substrate unaffected. The fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
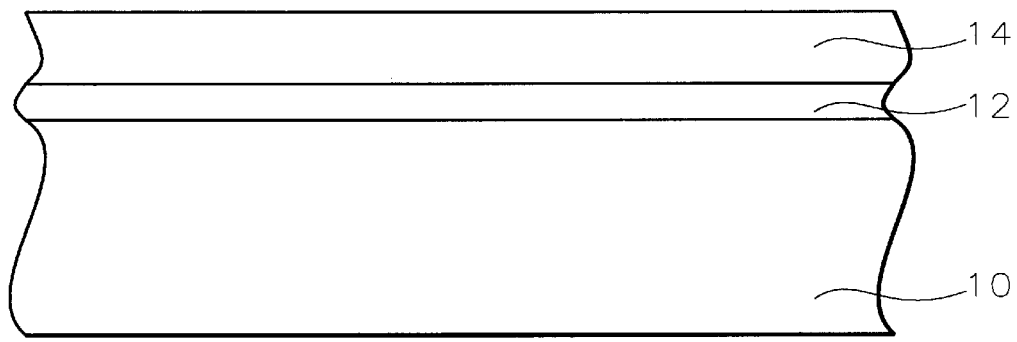
FIGS. 1 through 5 are cross-sectional representations of a first preferred embodiment of the present invention.

Referring now more particularly to FIG. 1, there is shown a semiconductor substrate 10. A layer of pad silicon oxide 12 is grown on the surface of the semiconductor substrate to a thickness of between about 90 and 300 Angstroms. A layer of silicon nitride 14 is deposited over the pad oxide layer 12 to a thickness of between about 1500 and 3000 Angstroms.

Figure 2:
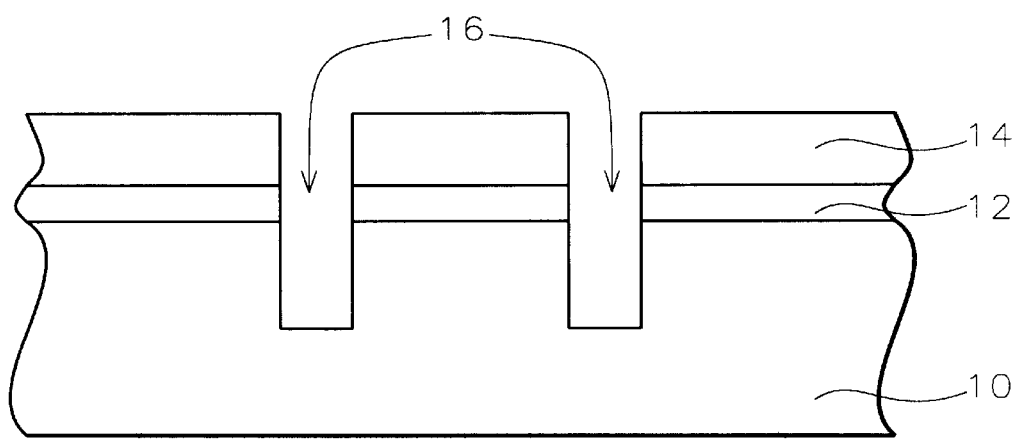

Referring now to FIG. 2, shallow trenches are etched into the silicon substrate using conventional photolithography and etching techniques. The shallow trenches 16 are etched to a depth of between 2500 and 5000 Angstroms into the semiconductor substrate.

Figure 3:
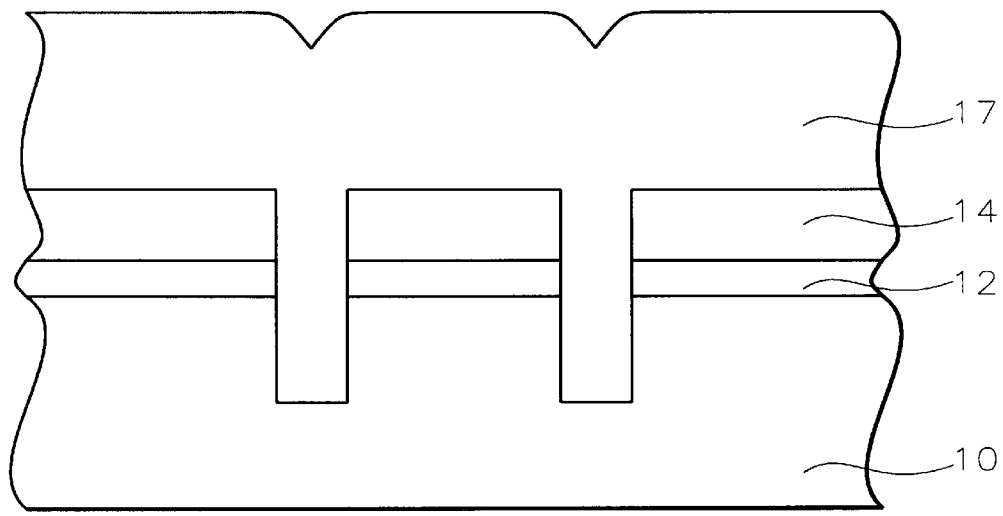

Referring now to FIG. 3, a layer of oxide 17 is deposited by chemical vapor deposition (CVD) to a thickness of between about 5000 and 8000 Angstroms over the surface of the substrate and filling the trenches.

Figure 4:
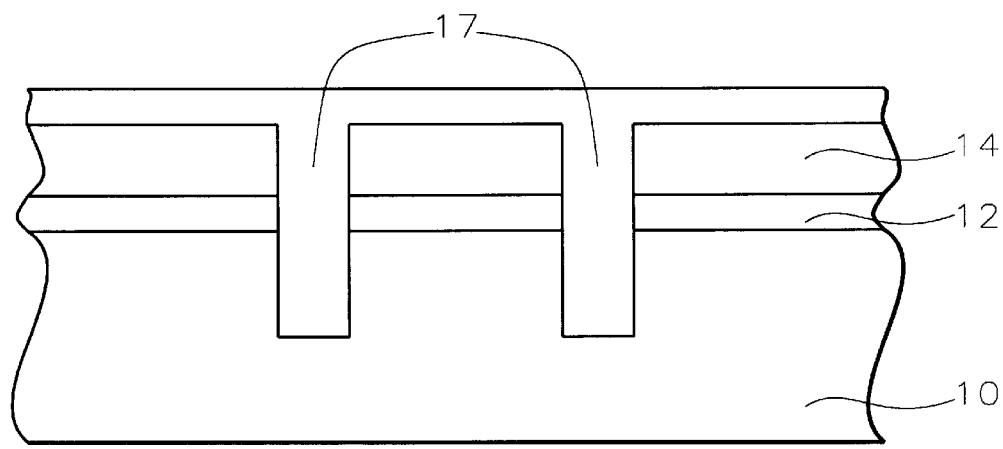

The oxide layer 17 is then polished using chemical mechanical polishing (CMP) resulting in the planarized shallow trench isolation illustrated in FIG. 4. The layer of oxide is polished to a thickness of between about 2500 and 5000 Angstroms over the surface of the substrate.

Figure 5:
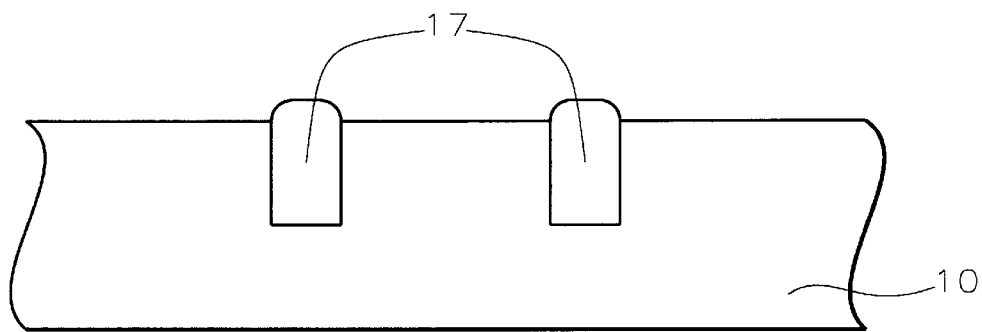

Referring now to FIG. 5, the silicon nitride layer 14 and oxide layer 17 over the surface of the substrate are then dry-etched away. A special dry-etch recipe is used for this step. The key parameters of the etching recipe are: Oz flow of between about 2 sc cm and 10 sccm, $CHF_3$ flow of between about 5 sccm and 30 sccm, and $CF_4$ flow of between about 5 sccm and 30 sccm at a pressure of between about 10 m Torr and 200 m Torr and rf-power of between about 300 Watts and 800 Watts. The etching selectivity of silicon nitride to oxide is between 1.1 and 1.5 to 1.0 (i.e. (1.1–1.5):1).

The dry etch process rounds the shoulders of the oxide layer 17 as it removes the silicon nitride layer 14 and pad oxide layer 12. The etching recipe has a very low etch rate for silicon; thus, the etching can stop at the silicon substrate. The selectivity of silicon nitride to silicon is greater than 5.

However, the dry etch could damage the substrate surface. An alternative process in accordance with the invention is depicted by FIGS. 6 through 10. Numerals common for layers of the embodiment of FIGS. 1–5 and the embodiment of FIGS. 6–10 have identically been used where appropriate. In this alternative, a sacrificial oxide layer is used to protect the surface of the substrate from etch damage.

Figure 6:
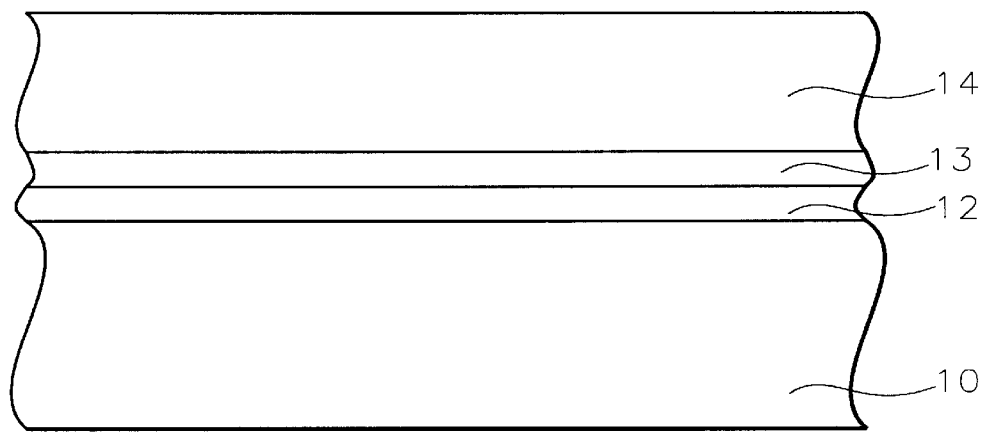
FIGS. 6 through 10 are cross-sectional representations of a second preferred embodiment of the present invention.

Referring to FIG. 6, a sacrificial oxide layer 13 has been deposited over the pad oxide layer 12. The sacrificial oxide layer is used to protect the substrate from the dry etch process in the case when the dry etch can attack the substrate. The sacrificial oxide layer has a thickness of between about 150 and 500 Angstroms.

Figure 7:
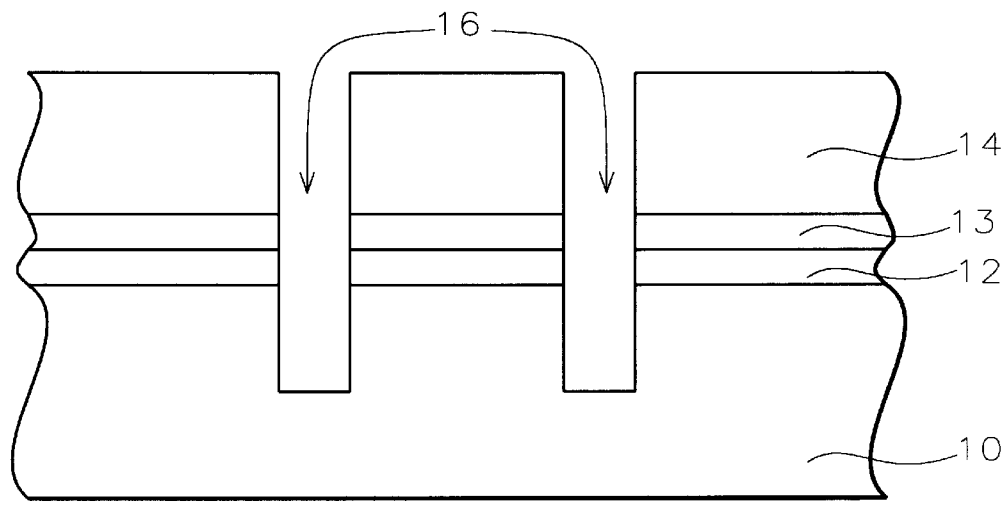

Referring now to FIG. 7, shallow trenches 16 are etched into the silicon substrate as described above using conventional photolithography and etching techniques.

Figure 8:
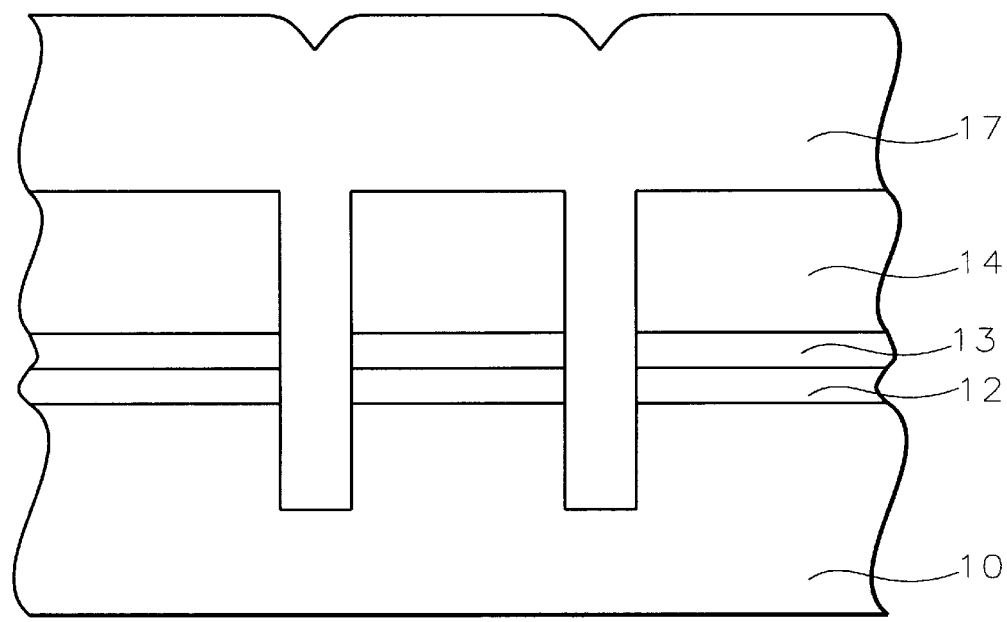

A layer of oxide 17 is deposited by chemical vapor deposition (CVD) to a thickness of between about 5000 and 8000 Angstroms over the surface of the substrate and filling the trenches, as shown in FIG. 8.

Figure 9:
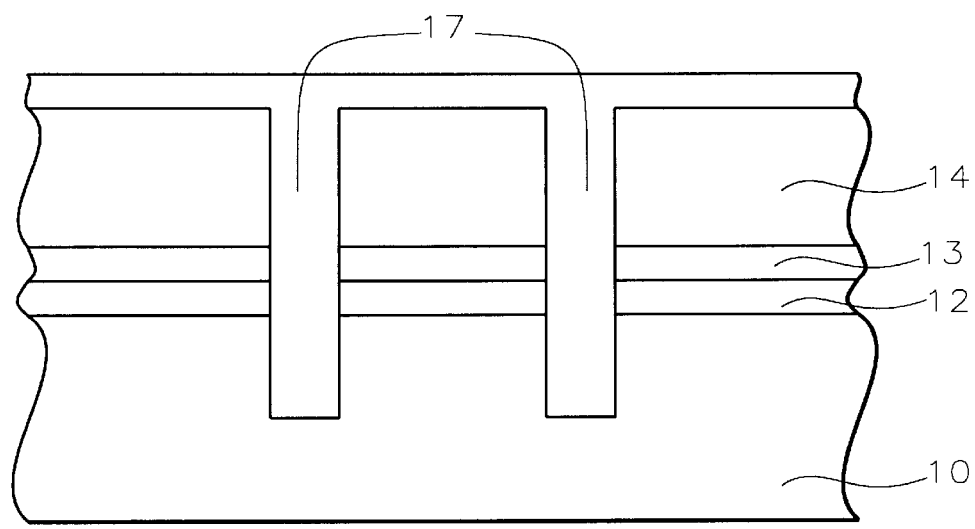

The oxide layer 17 is then polished using chemical mechanical polishing (CMP) resulting in the planarized shallow trench isolation illustrated in FIG. 9. The layer of oxide is polished to a thickness of between about 2500 and 5000 Angstroms over the surface of the substrate.

Figure 10:
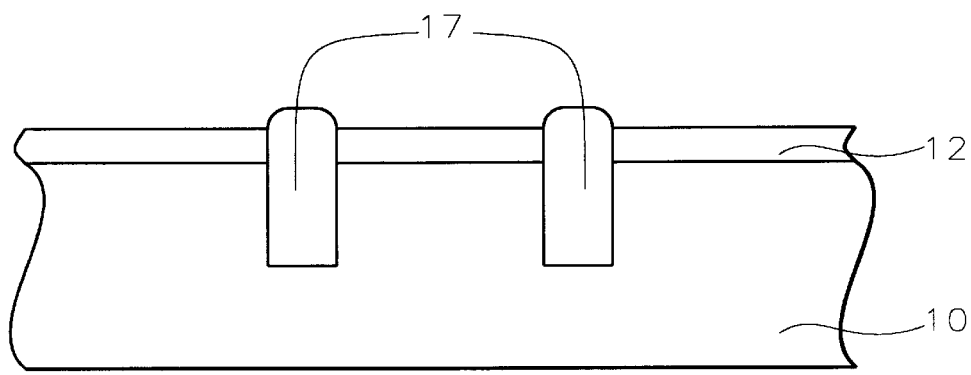

Referring now to FIG. 10, the silicon nitride layer 14 and oxide layer 17 over the surface of the substrate are then dry-etched away using the special dry-etch recipe described above. In this case, because of the presence of the sacrificial oxide layer 13, some of the pad oxide layer 12 remains after the silicon nitride layer has been completely removed and the shoulders of the oxide 17 have been rounded. Etching is controlled by time mode.

The process of the present invention results in the formation of planarized shallow trench isolation using a dry-etch process. The dry-etch process both removes the silicon nitride layer and rounds the shoulders of the oxide filling the trench in one step. This step is more efficient than the conventional wet-etching process that takes two steps to achieve the same effect. The result of this process is shown in FIGS. 5 and 10.

Figure 11:
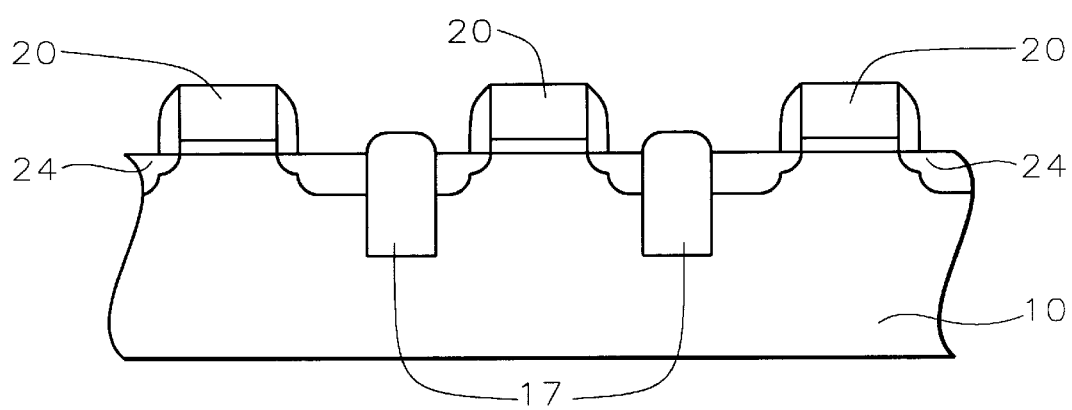
FIG. 11 is a cross-sectional representation of a completed integrated circuit device fabricated by the process of the present invention.

Processing then continues as is conventional in the art to form semiconductor device structures in and on the semiconductor substrate between or over the STI regions. For example, as illustrated in FIG. 11, gate electrodes 20 and source/drain regions 24 have been formed in and on the semiconductor substrate between the STI regions. Further processing, not shown, forms subsequent levels and electrical connections as is conventional in the art.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing a pad oxide layer over the surface of a silicon semiconductor substrate;

depositing a sacrificial oxide layer overlying said pad oxide layer;

depositing a nitride layer overlying said sacrificial oxide layer;

etching a plurality of isolation trenches through said nitride, sacrificial oxide, and said pad oxide layers into said semiconductor substrate;

depositing an oxide layer over said nitride layer and within said isolation trenches;

polishing away said oxide layer wherein said substrate is planarized;

etching back said nitride and oxide layers using an etching recipe that has a lower etching rate for said silicon substrate as compared with the etching rate of said nitride and oxide layers, and has a higher etching rate for the said nitride layer as compared with the said oxide layer whereby said nitride layer is etched away, said sacrificial oxide layer is etched away whereby said pad oxide layer is left overlying and protecting said silicon semiconductor substrate, and whereby the corners of said trench isolation areas are rounded; and completing the fabrication of said integrated circuit device.

2. The method according to claim 1 wherein said silicon nitride layer has a thickness of between about 1500 and 3000 Angstroms.

3. The method according to claim 1 wherein said oxide layer has a thickness of between about 5000 and 8000 Angstroms.

4. The method according to claim 1 wherein said polishing is done by chemical mechanical polishing.

5. The method according to claim 1 wherein said etching back is performed with a selectivity of silicon nitride to oxide of (1.1–1.5) to 1.0.

6. The method according to claim 1 wherein said etching back is performed with a selectivity of silicon nitride to said silicon semiconductor substrate of greater than 5.

7. The method according to claim 1 wherein said etching back is performed using a dry-etch recipe with the following parameters:

$O_2$ flow: between about 2 sccm and 10 sccm, $CHF_3$ flow: between about 5 sccm and 30 sccm, $CF_4$ flow: between about 5 sccm and 30 sccm, pressure: between about 10 m Torr and 200 m Torr, and rf-power: between about 300 Watts and 800 Watts.

8. The method according to claim 1 wherein said completing fabrication of said integrated circuit comprises fabricating semiconductor device structures in and on said semiconductor substrate between and over said isolation trenches.

9. A method of manufacturing an integrated circuit device comprising:

providing a pad oxide layer over the surface of a silicon semiconductor substrate;

depositing a sacrificial oxide layer overlying said pad oxide layer;

depositing a nitride layer overlying said sacrificial oxide layer;

etching a plurality of isolation trenches through said nitride layer, said sacrificial oxide layer and said pad oxide layer into said silicon semiconductor substrate;

depositing an oxide layer over said nitride layer and within said isolation trenches;

polishing away said oxide layer wherein said substrate is planarized;

etching back said nitride layer with a recipe having a selectivity of nitride to silicon of greater than 5 and a selectivity of nitride to oxide of (1.1–1.5) to 1.0 whereby said nitride layer is etched away and said sacrificial oxide layer and sharp corners of said trench isolation areas are etched away; and completing the fabrication of said integrated circuit device.

10. The method according to claim 9 wherein said sacrificial oxide layer has a thickness of between about 150 and 500 Angstroms.

11. The method according to claim 9 wherein said oxide layer has a thickness of between about 2500 and 5000 Angstroms.

12. The method according to claim 9 wherein said polishing is done by chemical mechanical polishing.

13. The method according to claim 9 wherein said etching back is performed using a dry-etch recipe with the following parameters:

$O_2$ flow: between about 2 sccm and 10 sccm, $CHF_3$ flow: between about 5 sccm and 30 sccm, $CF_4$ flow: between about 5 sccm and 30 sccm, pressure: between about 10 m Torr and 200 m Torr, and rf-power: between about 300 Watts and 800 Watts.

14. The method according to claim 9 wherein said completing fabrication of said integrated circuit comprises fabricating semiconductor device structures in and on said semiconductor substrate between and over said isolation trenches.

15. A method of manufacturing an integrated circuit device comprising:

providing a pad oxide layer over the surface of a silicon semiconductor substrate;

depositing a sacrificial oxide layer overlying said pad oxide layer;

depositing a silicon nitride layer overlying said sacrificial oxide layer;

etching a plurality of isolation trenches through said silicon nitride layer, said sacrificial oxide layer, and said pad oxide layer into said semiconductor substrate;

depositing an oxide layer over said silicon nitride layer and within said isolation trenches;

polishing away said oxide layer wherein said substrate is planarized;

etching back said silicon nitride layer using a dry etch recipe comprising $O_2$, $CHF_3$, and $CF_4$ and having a selectivity of silicon nitride to silicon of greater than 5 and a selectivity of silicon nitride to oxide of (1.1–1.5) to 1.0 whereby said silicon nitride layer is etched away, said sacrificial oxide layer is etched away whereby said pad oxide layer is left overlying and protecting said silicon semiconductor substrate, and sharp corners of said trench isolation areas are etched away; and completing the fabrication of said integrated circuit device.

16. The method according to claim 15 wherein said sacrificial oxide layer has a thickness of between about 150 and 500 Angstroms.

17. The method according to claim 15 wherein said oxide layer has a thickness of between about 2500 and 5000 Angstroms.

18. The method according to claim 15 wherein said polishing is done by chemical mechanical polishing.

19. The method according to claim 15 wherein said etching back is performed using a dry-etch recipe with the following parameters:

$O_2$ flow: between about 2 sccm and 10 sccm, $CHF_3$ flow: between about 5 sccm and 30 sccm, $CF_4$ flow: between about 5 sccm and 30 sccm, pressure: between about 10 m Torr and 200 m Torr, and rf-power: between about 300 Watts and 800 Watts.

* * * * *